United States Patent
Lai et al.

(10) Patent No.: US 6,974,749 B2
(45) Date of Patent: Dec. 13, 2005

(54) BOTTOM OXIDE FORMATION PROCESS FOR PREVENTING FORMATION OF VOIDS IN TRENCH

(75) Inventors: Shih-Chi Lai, Hsinchu (TW); Yifu Chung, Hsinchu (TW); Yi-Chuan Yang, Hsinchu (TW); Jen-Chieh Chang, Hsinchu (TW); Jason Chien-Sung Chu, Hsinchu (TW); Chun-De Lin, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 10/677,568

(22) Filed: Oct. 1, 2003

(65) Prior Publication Data
US 2004/0203217 A1 Oct. 14, 2004

(30) Foreign Application Priority Data
Apr. 11, 2003 (TW) ........................................ 92108472 A

(51) Int. Cl.[7] ............................................ H01L 21/336
(52) U.S. Cl. ........................ 438/270; 438/268; 257/330
(58) Field of Search ................................ 257/330, 335; 438/268, 270, 424, 430, 432

(56) References Cited

U.S. PATENT DOCUMENTS

| | | | | |
|---|---|---|---|---|
| 5,741,740 A | * | 4/1998 | Jang et al. | 438/435 |
| 6,444,528 B1 | * | 9/2002 | Murphy | 438/270 |
| 6,674,124 B2 | * | 1/2004 | Hshieh et al. | 257/330 |
| 6,709,930 B2 | * | 3/2004 | Chan et al. | 438/270 |
| 2003/0089946 A1 | * | 5/2003 | Hshieh et al. | 257/338 |
| 2003/0186507 A1 | * | 10/2003 | Henninger et al. | 438/270 |
| 2003/0235958 A1 | * | 12/2003 | Chan et al. | 438/270 |
| 2004/0018705 A1 | * | 1/2004 | Colson et al. | 438/570 |
| 2004/0121572 A1 | * | 6/2004 | Darwish et al. | 438/589 |

* cited by examiner

Primary Examiner—Christian Wilson
(74) Attorney, Agent, or Firm—Townsend and Townsend and Crew LLP

(57) ABSTRACT

Embodiments of the present invention are directed to a method of forming a bottom oxide layer in the trench in semiconductor devices, such as Double-Diffused Metal-Oxide Semiconductor (DMOS) devices. In one embodiment, a method of forming a bottom oxide layer in a trench structure comprises providing a semiconductor substrate; forming a silicon nitride layer on the semiconductor substrate; forming a first oxide layer on the silicon nitride layer; forming a trench structure in the semiconductor substrate; forming a second oxide layer on a bottom and sidewalls of the trench and on a surface of the first oxide layer; removing the first oxide layer and the second oxide layer on the surface of the silicon nitride layer; and removing the second oxide layer on the sidewalls of the trench and a portion of the second oxide layer on the bottom of the trench.

23 Claims, 6 Drawing Sheets

BOTTOM OXIDE FORMATION PROCESS FOR PREVENTING FORMATION OF VOIDS IN TRENCH

CROSS-REFERENCES TO RELATED APPLICATIONS

This application claims priority from R.O.C. Patent Application No. 092108472, filed Apr. 11, 2003, the entire disclosure of which is incorporated herein by reference.

BACKGROUND OF THE INVENTION

The present invention relates to a method of forming a bottom oxide layer and conductive layers in a trench, and more particularly to a method of forming a bottom oxide layer and conductive layers in a trench structure of a trench-type power Double-Diffused Metal-Oxide Semiconductor (DMOS) device without formation of voids.

Nowadays, Double-Diffused Metal-Oxide Semiconductor (DMOS) devices are widely used in the semiconductor industry. FIGS. 1(a) to 1(f) are schematic cross-sectional views illustrating a conventional process for forming a bottom oxide layer in a trench structure of a Double-Diffused Metal-Oxide Semiconductor (DMOS) device. As shown in FIG. 1(a), before the manufacture of DMOS devices, a semiconductor substrate 101 is provided first. Then, a pad oxide layer 102, a silicon nitride layer 103 and a first oxide layer 104 are sequentially formed on the semiconductor substrate 101. The first oxide layer 104, the silicon nitride layer 103, the pad oxide layer 102 and the semiconductor substrate 101 are partially removed to form at least one trench structure 105 on the semiconductor substrate 101 by conventional photolithography and etching processes. Thereafter, as shown in FIG. 1(b), the second oxide layer 106 is formed on the bottom and the sidewalls of the trench 105 and on the surface of the first oxide layer 104 by High Density Plasma Chemical Vapor Deposition (HDPCVD) process.

After an etching process is performed to remove the second oxide layer 106 on the sidewalls 1051 of the trench 105, as shown in FIG. 1(c), only a small portion of the second oxide layer 106 on the bottom of the trench 105 will remain and be defined as a bottom oxide layer 108. Afterwards, as shown in FIG. 1(d), a conductive layer 107 is allowed to fill in the trench structure and deposits on the second oxide layer 106, and the conductive layer 107 usually comprises polysilicon.

Because in the conventional process, the second oxide layer 106 is formed with High Density Plasma Chemical Vapor Deposition (HDPCVD) process, the second oxide layer 106 will be formed with a ladder shape. The conductive material 107 will be deposited along the ladder-shaped second oxide layer 106 in the HDPCVD process. As a result, a void 1052 is formed in the conductive material 107 on the trench 105 as shown in FIG. 1(d). Because of the existence of the void 1052 in the conductive material 107 on the trench 105, after a planarization process is subsequently performed, as shown in FIG. 1(e), portions of the void 1052 would be exposed, and a cavity 10521 will be formed in the conductive material 107 on the trench. Thus, the effect of the point discharge would occur on the cavity 10521, and the current leakage will also easily occur when semiconductor devices are used.

Therefore, it is desirable to develop a method of forming a bottom oxide layer and conductive layers in the trench without the formation of voids while the trench is filled with the conductive layer, and a method of preventing the current leakage of semiconductor devices.

BRIEF SUMMARY OF THE INVENTION

Embodiments of the present invention are directed to a method of forming a bottom oxide layer in the trench in semiconductor devices, such as Double-Diffused Metal-Oxide Semiconductor (DMOS) devices. The method disclosed in this invention can prevents the formation of voids in the Double-Diffused Metal-Oxide Semiconductor (DMOS) devices and further prevents the current leakage happening while the Double-Diffused Metal-Oxide Semiconductor (DMOS) devices are used.

In accordance with an aspect of the present invention, a method of forming a bottom oxide layer in a trench structure comprises providing a semiconductor substrate; forming a silicon nitride layer on the semiconductor substrate; forming a first oxide layer on the silicon nitride layer; forming a trench structure in the semiconductor substrate; forming a second oxide layer on a bottom and sidewalls of the trench and on a surface of the first oxide layer; removing the first oxide layer and the second oxide layer on the surface of the silicon nitride layer; and removing the second oxide layer on the sidewalls of the trench and a portion of the second oxide layer on the bottom of the trench.

In some embodiments, a pad oxide is formed before forming the silicon nitride layer. Removing the first oxide layer and the second oxide layer on the surface of the silicon nitride layer is performed by a chemical mechanical polishing process. The silicon nitride layer serves as a stop layer for the chemical mechanical polishing process. Forming a second oxide layer on the bottom and sidewalls of the trench and on the surface of the first oxide layer is performed by a Plasma Enhanced Tetra Ethyl Ortho Silicon (PE-TEOS) process. The first oxide layer and the second oxide layer each comprise silicon oxide. Removing the second oxide layer on the sidewalls of the trench and portion of the second oxide layer on the bottom of the trench is performed by a wet etching process. The wet etching process may use an etching solution comprising HF, or a Buffered Oxide Etch (BOE) solution comprising HF and $NH_4F$.

In accordance with another aspect of the invention, a method of manufacturing Diffused Metal-Oxide Semiconductor (DMOS) devices comprises providing a semiconductor substrate; forming a silicon nitride layer on the semiconductor substrate; forming a first oxide layer on the silicon nitride layer; forming a trench structure in the semiconductor substrate; forming a second oxide layer on the bottom and sidewalls of the trench and on a surface of the first oxide layer; removing the first oxide layer and the second oxide layer on the surface of the silicon nitride layer; removing the second oxide layer on the sidewalls of the trench and a portion of the second oxide layer on the bottom of the trench; forming a conductive layer over the silicon nitride layer on semiconductor substrate and the trench; and removing the conductive layer on the silicon nitride layer.

In accordance with another aspect of this invention, a method of forming a bottom oxide layer in a trench of a semiconductor substrate comprises providing a semiconductor substrate including a trench disposed between islands having a first oxide layer formed thereon; forming a second oxide layer over the first oxide layer of the islands and on a bottom and sidewalls of the trench; removing the first oxide layer and the second oxide layer from the islands; and removing the second oxide layer on the sidewalls of the trench and a portion of the second oxide layer on the bottom of the trench.

In some embodiments, the second oxide layer is formed by a Plasma Enhanced Tetra Ethyl Ortho Silicon (PE-TEOS) process, and is thicker on the bottom of the trench than on the sidewalls of the trench. The first oxide layer and the second oxide layer are removed from the islands by chemical mechanical polishing. Removing the second oxide layer on the sidewalls of the trench and a portion of the second oxide layer on the bottom of the trench is performed with a wet etching process.

DETAILED DESCRIPTION OF THE INVENTION

Embodiments of the present invention provides a method of forming a bottom oxide layer in the trench applied to Double-Diffused Metal-Oxide Semiconductor (DMOS) devices. The method disclosed in this invention can prevents the formation of voids in the Double-Diffused Metal-Oxide Semiconductor (DMOS) devices when filling a conductive material in the trench and further prevents the current leakage happening when the Double-Diffused Metal-Oxide Semiconductor (DMOS) devices are used. The below embodiments will be described with a Double-Diffused Metal-Oxide Semiconductor (DMOS) device as an example, however, other types of a trench-type MOSFET can also be applied with the present invention.

Figure 2A:
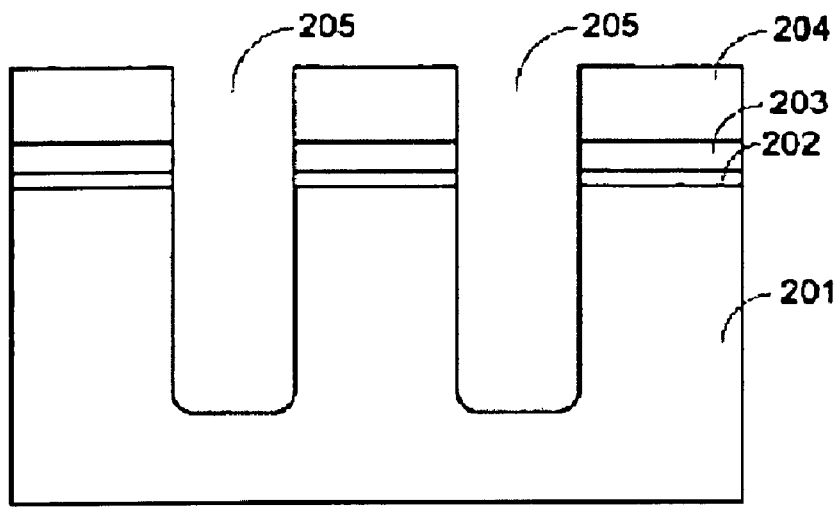
FIGS. 2(a) to (f) are schematic cross-sectional views illustrating the process of forming a bottom oxide layer according to an embodiment of the present invention.

FIGS. 2(a) to 2(f) are schematic cross-sectional views illustrating the process of forming a bottom oxide layer according to an embodiment of the present invention. As shown in FIG. 2(a), a semiconductor substrate 201, for example, silicon substrate, is first provided in the manufacturing process of the Double-Diffused Metal-Oxide Semiconductor (DMOS) device. Then, a pad oxide layer 202, a silicon nitride layer 203 and a first oxide layer 204 are sequentially formed on the semiconductor substrate 201. In the present invention, the pad oxide layer 202 serves as a buffer for lowering the stress between the semiconductor substrate 201 and the silicon nitride layer 203. Preferably, the first oxide layer 204 is silicon oxide. Thereafter, the first oxide layer 204, the silicon nitride layer 203, the pad oxide layer 202, and the semiconductor substrate 201 are removed partially to form at least one trench 205 on the semiconductor substrate 201 between islands with photolithography and etching process. The trench 205 typically has a depth of about 1.5 μm to 2.5 μm measured from the surface of the islands and a width of about 0.5 μm between the islands.

Figure 2B:
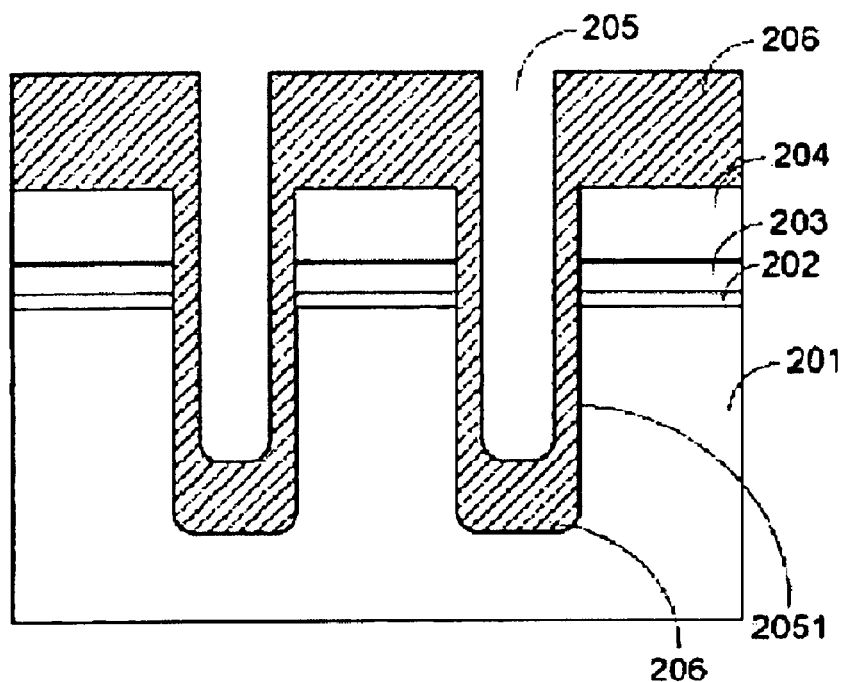
Figure 2C:
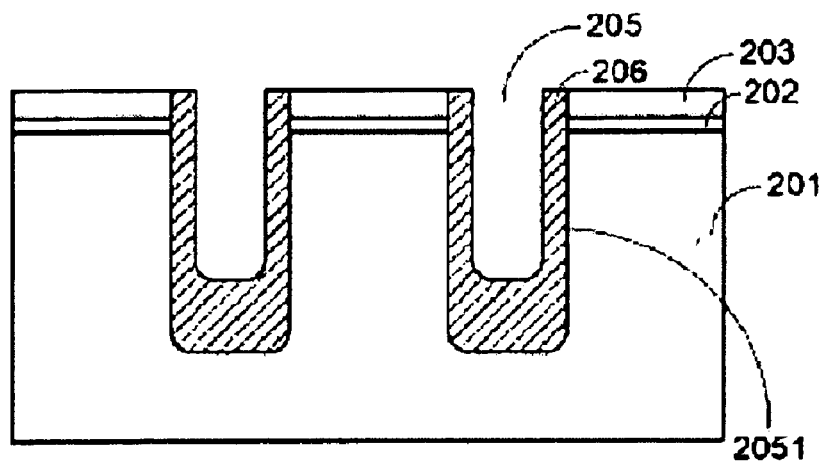
Figure 2D:
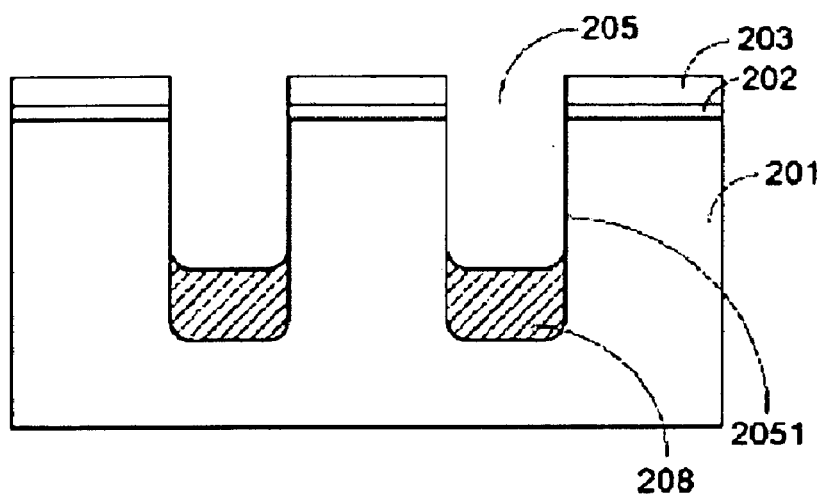

Then, a second oxide layer 206 is formed on the bottom and sidewalls of the trench 205 as shown in FIG. 2(b). In an exemplary embodiment, the second oxide layer 206 is formed by a Plasma Enhanced Tetra Ethyl Ortho Silicon (PE-TEOS) process. The second oxide layer 206 further covers the surface of the first oxide layer 204. The second oxide layer 206 is preferably silicon oxide. In the exemplary embodiment, the Plasma Enhanced Tetra Ethyl Ortho Silicon (PE-TEOS) is performed at a temperature of about 400° C. to 440° C. As seen in FIG. 2(c), a chemical mechanical process (CMP) is performed on the surface of the semiconductor substrate 201 to remove the first oxide layer 204 and the second oxide layer 206 on the surface of the silicon nitride layer 203. In this embodiment, the silicon nitride layer 203 can serve as a stop layer in the chemical mechanical process (CMP). After that, as shown in FIG. 2(d), an etching process is performed to etch the second oxide layer 206, until the second oxide layer 206 on the sidewalls of the trench 2051 is totally removed. After the etching process, portion of the second oxide layer 106 on the bottom of the trench 205 will remain and be defined as a bottom oxide layer 208. In the exemplary embodiment, the etching process is performed with wet etching process, and the etching solution used in the etching process comprises HF. In another embodiment, the etching solution may be a Buffered Oxide Etch (BOE) solution comprising HF and $NH_4F$. Of course, the etching solution further may comprise surfactants and substantially 0% to 10% by weight of $NH_4F$, substantially about 0.05% to about 8.5% by weight of HF, substantially about 81.5% to about 99.9% by weight of deionized water, and/or substantially about 25 ppm to about 2,000 ppm of surfactants.

In the exemplary embodiment of the present invention, the second oxide layer 206 is formed by a Plasma Enhanced Tetra Ethyl Ortho Silicon (PE-TEOS) process, so that the second oxide layer 206 on the bottom of the trench 205 is thicker than that on the sidewalls 2051 of the trench 205. Therefore, after the second oxide layer 206 on the sidewalls 2051 of the trench 205 is etched and totally removed, the portion of the second oxide layer that remains will have a relatively large thickness which can meet the required thickness to serve as the bottom oxide layer 208.

Figure 2E:
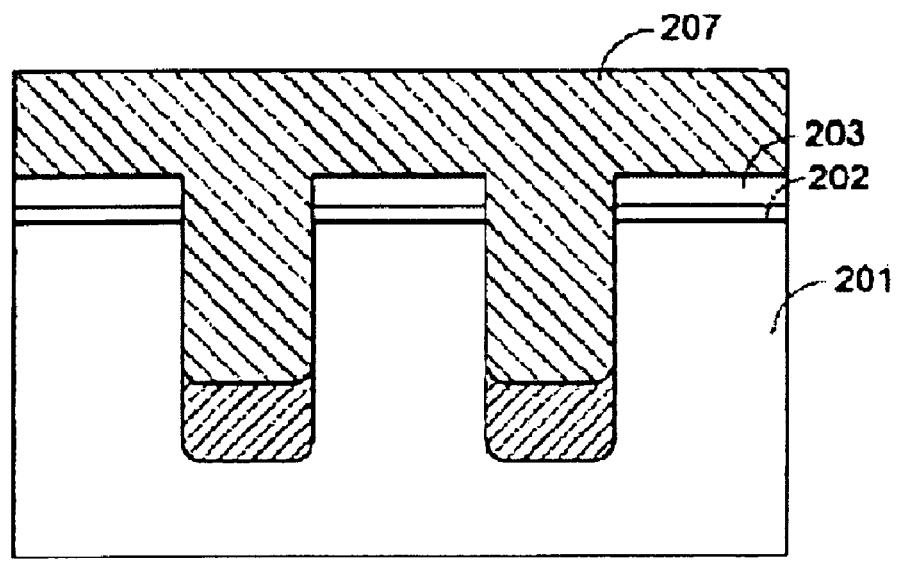
Figure 2F:
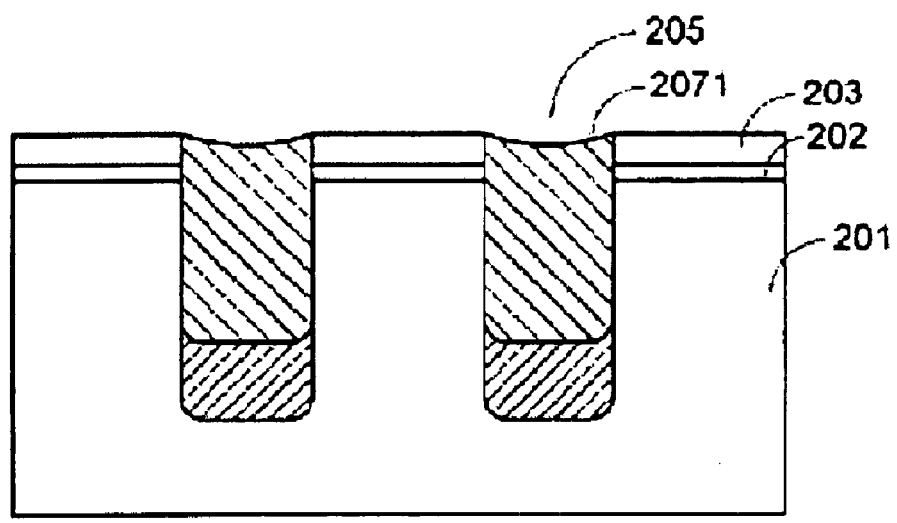

Subsequently, as shown in FIG. 2(e), a conductive layer 207 is formed on the semiconductor substrate 201 and the trench 205 is also filled with the conductive layer 207. The conductive layer 207 is preferably polysilicon. After that, as shown in FIG. 2(f), a planarization process is performed on the semiconductor substrate 201 to form a concave structure 2071 on the conductive layer 207 in the trench 205.

Figure 1A:
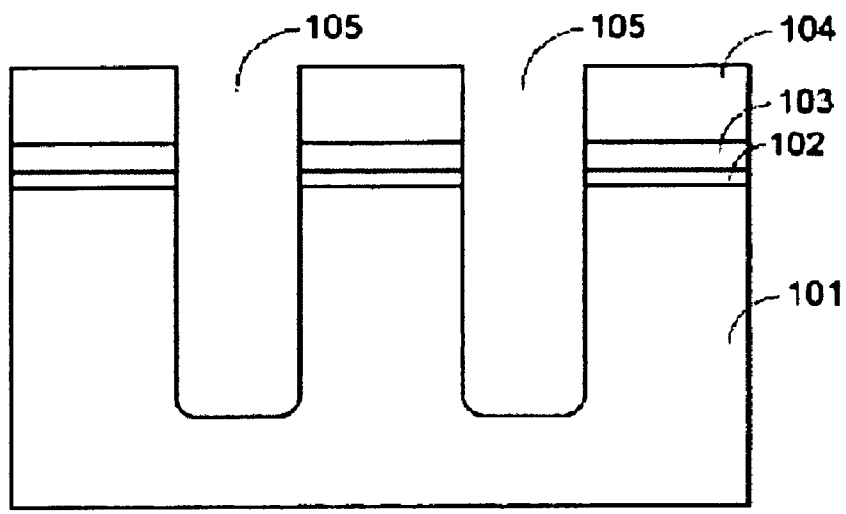
FIGS. 1(a) to (e) are schematic cross-sectional views illustrating a conventional process for forming a bottom oxide layer in a trench structure of a Double-Diffused Metal-Oxide Semiconductor (DMOS) device.
Figure 1B:
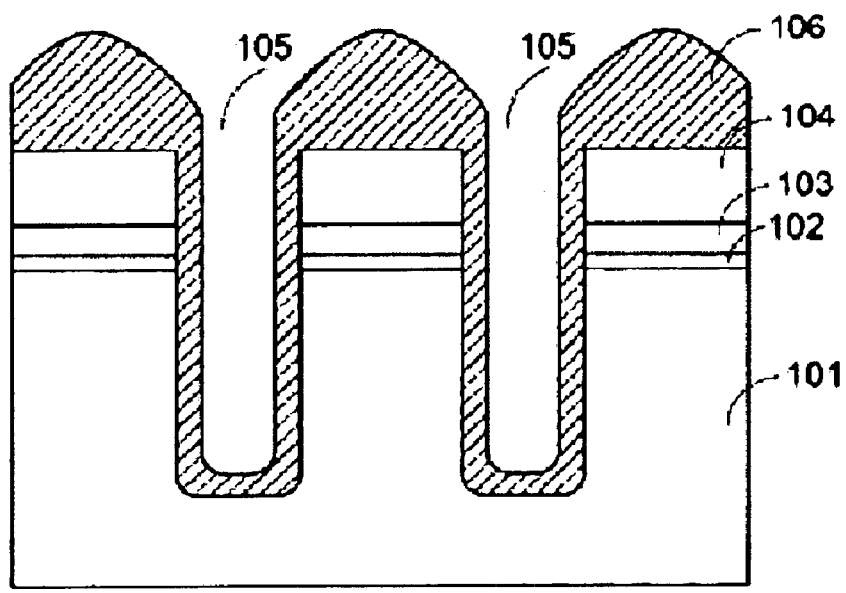
Figure 1C:
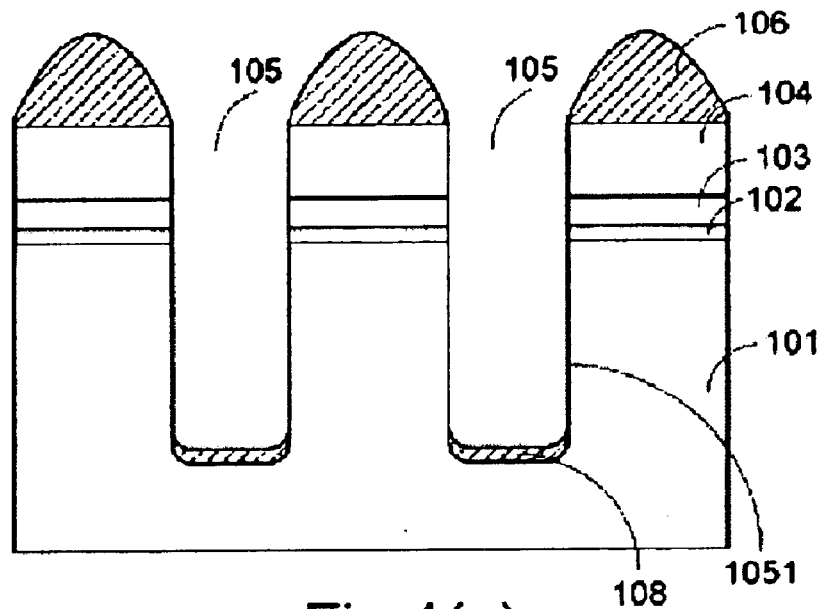
Figure 1D:
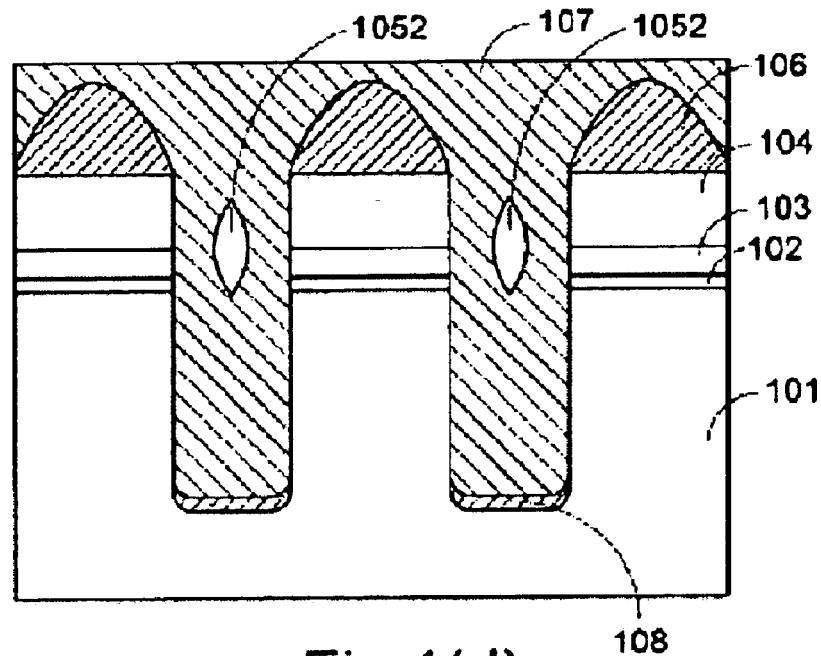
Figure 1E:
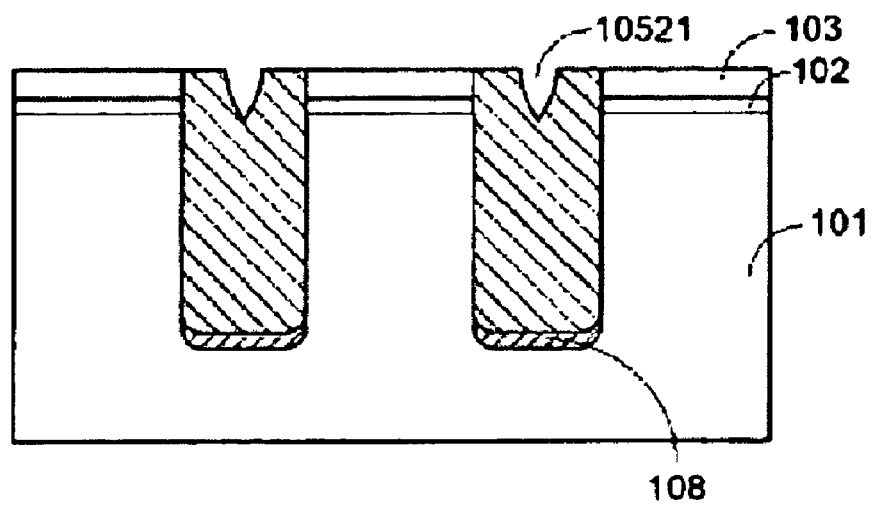

In the exemplary embodiment, the second oxide layer 206 is formed by Plasma Enhanced Tetra Ethyl Ortho Silicon (PE-TEOS) process but not formed by convention process, so that the second oxide layer is no longer formed with a ladder shape as the conventional second oxide layer. Further, the chemical mechanical process (CMP) is performed to remove the first oxide layer and the second oxide layer on the surface of the semiconductor substrate, and the wet etching process is performed to remove the second oxide layer in the trench before the conductive layer is formed on the substrate layer. Thus, when conductive layer is formed on the semiconductor substrate, the conductive layer will deposit directly on the surface of the semiconductor substrate and in the trench. As a result, the conductive layer in the trench will have no void, and after the subsequent planarization process is performed, the desirable concave structure will be formed on the conductive layer in the trench, instead of the cavity 10521 shown in FIG. 1(f).

To sum up, the exemplary embodiment of the present invention employs Plasma Enhanced Tetra Ethyl Ortho Silicon (PE-TEOS) process to form the second oxide layer and employs the chemical mechanical process (CMP) to remove the first oxide layer and the second oxide layer on the surface of the semiconductor substrate. Further, in the present invention, the second oxide layer on the sidewalls of the trench is removed by wet etching process, so that a bottom oxide layer is formed with a desired thickness in the bottom of the trench to serve as an isolation layer. Therefore, there will be no void formed in the following process of forming conductive layer (for example, polysilicon) on the semiconductor substrate. It can prevent the formation of cavities on the conductive layer, the effect of point discharge of semiconductor elements, and the occurrence of current leakage. Moreover, because High Density Plasma Chemical Vapor Deposition (HDPCVD) process requires a number of equipments and cost, the present invention replaces High Density Plasma Chemical Vapor Deposition (HDPCVD) process with Plasma Enhanced Tetra Ethyl Ortho Silicon (PE-TEOS) process to form the second oxide layer, further lowering the cost. Therefore, the method according to the present invention not only prevents the voids formed on the conductive layer in the trench, but also saves the cost and time in manufacturing semiconductor elements.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. A method of forming a bottom oxide layer in a trench structure, the method comprising:

providing a semiconductor substrate;

forming a silicon nitride layer on the semiconductor substrate;

forming a first oxide layer on the silicon nitride layer;

forming a trench structure disposed between islands in the semiconductor substrate, the islands having formed thereon the silicon nitride layer and the first oxide layer;

forming a second oxide layer on a bottom and sidewalls of the trench and on a surface of the first oxide layer on the islands;

removing the first oxide layer and the second oxide layer on the surface of the silicon nitride layer and leaving the silicon nitride layer on the islands; and removing the second oxide layer on the sidewalls of the trench and a portion of the second oxide layer on the bottom of the trench and leaving the silicon nitride layer on the islands.

2. The method according to claim 1 further comprises forming a pad oxide before forming the silicon nitride layer.

3. The method according to claim 1, wherein removing the first oxide layer and the second oxide layer on the surface of the silicon nitride layer is performed by a chemical mechanical polishing process.

4. The method according to claim 3, wherein the silicon nitride layer serves as a stop layer for the chemical mechanical polishing process.

5. The method according to claim 1, wherein forming a second oxide layer on the bottom and sidewalls of the trench and on the surface of the first oxide layer is performed by a Plasma Enhanced Tetra Ethyl Ortho Silicon (PE-TEOS) process.

6. The method according to claim 1, wherein the first oxide layer and the second oxide layer each comprise silicon oxide.

7. The method according to claim 1, wherein removing the second oxide layer on the sidewalls of the trench and portion of the second oxide layer on the bottom of the trench is performed by a wet etching process.

8. The method according to claim 7, wherein the wet etching process uses an etching solution comprising HF.

9. The method according to claim 7, wherein the wet etching process uses an etching solution, the etching solution being a Buffered Oxide Etch (BOE) solution comprising HF and $NH_4F$.

10. A method of manufacturing Diffused Metal-Oxide Semiconductor (DMOS) devices, the method comprising:

providing a semiconductor substrate;

forming a silicon nitride layer on the semiconductor substrate;

forming a first oxide layer on the silicon nitride layer;

forming a trench structure disposed between islands in the semiconductor substrate, the islands having formed thereon the silicon nitride layer and the first oxide layer;

forming a second oxide layer on the bottom and sidewalls of the trench and on a surface of the first oxide layer on the islands;

removing the first oxide layer and the second oxide layer on the surface of the silicon nitride layer;

removing the second oxide layer on the sidewalls of the trench and a portion of the second oxide layer on the bottom of the trench;

forming a conductive layer over the silicon nitride layer on the semiconductor substrate and the trench; and removing the conductive layer on the silicon nitride layer.

11. The method according to claim 10, wherein the conductive layer comprises polysilicon.

12. The method according to claim 10 further comprises forming a pad oxide before forming the silicon nitride layer.

13. The method according to claim 10, wherein removing the first oxide layer and the second oxide layer on the surface of the silicon nitride layer is performed by a chemical mechanical polishing process.

14. The method according to claim 13, wherein the silicon nitride layer serves as a stop layer for the chemical mechanical polishing process.

15. The method according to claim 10, wherein forming a second oxide layer on the bottom and sidewalls of the trench and on the surface of the first oxide layer is performed by a Plasma Enhanced Tetra Ethyl Ortho Silicon (PE-TEOS) process.

16. The method according to claim 10, wherein the first oxide layer and the second oxide layer each comprise silicon oxide.

17. The method according to claim 10, wherein removing the second oxide layer on the sidewalls of the trench and portion of the second oxide layer on the bottom of the trench is performed with a wet etching process.

18. The method according to claim 17, wherein the wet etching process uses an etching solution comprising HF.

19. The method according to claim 17 wherein the wet etching process uses an etching solution, the etching solution being a Buffered Oxide Etch (BOE) solution comprising HF and $NH_4F$.

20. A method of forming a bottom oxide layer in a trench of a semiconductor substrate, the method comprising:

providing a semiconductor substrate including a trench disposed between islands having a first oxide layer formed thereon;

forming a second oxide layer over the first oxide layer of the islands and on a bottom and sidewalls of the trench;

removing the first oxide layer and the second oxide layer from the islands; and removing the second oxide layer on the sidewalls of the trench and a portion of the second oxide layer on the bottom of the trench.

21. The method according to claim 20, wherein the second oxide layer is formed by a Plasma Enhanced Tetra Ethyl Ortho Silicon (PE-TEOS) process, and is thicker on the bottom of the trench than on the sidewalls of the trench.

22. The method according to claim 20, wherein the first oxide layer and the second oxide layer are removed from the islands by chemical mechanical polishing.

23. The method according to claim 20, wherein removing the second oxide layer on the sidewalls of the trench and a portion of the second oxide layer on the bottom of the trench is performed with a wet etching process.

* * * * *